United States Patent
Takesako et al.

(10) Patent No.: US 9,804,197 B2
(45) Date of Patent: Oct. 31, 2017

(54) EVALUATION APPARATUS AND PROBE POSITION INSPECTION METHOD

(71) Applicant: Mitsubishi Electric Corporation, Tokyo (JP)

(72) Inventors: Norihiro Takesako, Tokyo (JP); Akira Okada, Tokyo (JP); Takaya Noguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/283,617

(22) Filed: Oct. 3, 2016

(65) Prior Publication Data

US 2017/0199225 A1    Jul. 13, 2017

(30) Foreign Application Priority Data

Jan. 8, 2016   (JP) .................. 2016-002890

(51) Int. Cl.
*G01R 1/067* (2006.01)
*G01R 1/073* (2006.01)
*G01R 1/04* (2006.01)

(52) U.S. Cl.
CPC ....... *G01R 1/06794* (2013.01); *G01R 1/0408* (2013.01); *G01R 1/07307* (2013.01)

(58) Field of Classification Search
CPC ........ G01R 1/0408; G01R 1/06; G01R 1/067; G01R 1/06794; G01R 1/073–1/07392; G01R 31/2851; G01R 31/2886–31/2891
See application file for complete search history.

(56) References Cited

U.S. PATENT DOCUMENTS

| | | | | |
|---|---|---|---|---|
| 4,929,893 A | * | 5/1990 | Sato .................. | G01R 31/2886 324/750.19 |
| 5,657,394 A | * | 8/1997 | Schwartz ........... | G01R 1/07307 382/151 |
| 6,710,798 B1 | * | 3/2004 | Hershel ............. | G01R 31/2887 324/750.23 |
| 2001/0050572 A1 | * | 12/2001 | Nishikawa ........ | G01R 31/2887 324/750.18 |
| 2004/0140820 A1 | * | 7/2004 | Sakagawa ......... | G01R 31/2851 324/754.07 |
| 2009/0212804 A1 | | 8/2009 | Yamada et al. | |
| 2017/0102410 A1 | * | 4/2017 | Takesako ........... | G01R 1/04 |

FOREIGN PATENT DOCUMENTS

| | | |
|---|---|---|
| JP | Hei05-157790 A | 6/1993 |
| JP | 2001-189353 A | 7/2001 |
| JP | 2009-198407 A | 9/2009 |

* cited by examiner

*Primary Examiner* — Huy Q Phan
*Assistant Examiner* — David Frederiksen
(74) *Attorney, Agent, or Firm* — Studebaker & Brackett PC (57) ABSTRACT

A probe position inspection apparatus which incorporates a rotatable internal prism is attached to a supporting unit for supporting semiconductor device, thus making it possible to accurately inspect in-plane positions of tips of probes in a short time and also making it possible to adapt the probe position inspection apparatus to a double-sided prober.

17 Claims, 8 Drawing Sheets

EVALUATION APPARATUS AND PROBE POSITION INSPECTION METHOD

BACKGROUND OF THE INVENTION

Field of the Invention

The present invention relates to an evaluation apparatus for detecting the positions of tips of probes and a probe position inspection method.

Background Art

A semiconductor wafer or a chip obtained by singulating a semiconductor wafer is an object to be measured for which electrical characteristics are evaluated before shipping. When electrical characteristics of an object to be measured are evaluated, a lower surface of an object to be measured is fixed to a surface of a chuck stage by vacuum suction or the like, and then a probe for electrical input and output is brought into contact with an electrode provided in a portion of an upper surface of the object to be measured. In the evaluation of a semiconductor device having a vertical structure through which a large current is vertically passed, the surface of the chuck stage serves as an electrode. In evaluation in which a large current is passed or in which a high voltage is applied, the number of probes is increased.

When electrical characteristics of a semiconductor device are evaluated, it is important to bring a plurality of probes into contact with a surface electrode of the semiconductor device with high positional accuracy. If contact positions between probes and the surface electrode are misaligned, a desired current or voltage may not be applied to the semiconductor device. Moreover, if the probes come in contact with a portion of the semiconductor device other than the surface electrode, the semiconductor device may be damaged. In particular, in the case where a double-sided prober which brings probes into contact with both sides of the semiconductor device is used, the above-described misalignment may cause damage to the semiconductor device.

To reduce contact position misalignment between probes and a semiconductor device, it is desirable to use short probes. However, the lengths of probes tend to be increased so that discharge phenomena may be reduced by increasing the distance between a body portion of a probe card and the semiconductor device. Accordingly, contact position misalignment between probes and a semiconductor device is liable to occur.

It has been known that a non-contact probe position measurement method is used to inspect whether probes constitute a misalignment factor or not. For example, probe positions are measured by image processing using a camera installed to face the probes. In this case, when the positions of tip portions of the probes are measured, a change in the background, variations in the distances between the probes and the camera, variations in focusing accuracy among the probes, the influence of substances attached to the probes, and the like all become disturbance factors and interfere with accurate measurement.

Japanese Patent Application Publication Nos. 2001-189353, 2009-198407, and H05-157790 also disclose probe position evaluation methods. Japanese Patent Application Publication No. 2001-189353 discloses observing the positions and sizes of probe marks obtained by bringing probes into contact with a deformable body. Japanese Patent Application Publication No. 2009-198407 includes a disclosure of the erasing of needle mark on a needle mark transfer member. Japanese Patent Application Publication No. H05-157790 discloses performing an inspection with a measuring needle pressed against a flat transparent glass plate.

The probe inspection in Japanese Patent Application Publication No. 2001-189353 requires a process for recycling the deformable body every time a probe inspection is performed, and requires observation after the transfer of probe marks, thus requiring a long inspection time. Moreover, an evaluation apparatus disclosed in Japanese Patent Application Publication No. 2001-189353 cannot be easily added to a prior-art evaluation apparatus. The needle mark transfer member in Japanese Patent Application Publication No. 2009-198407 also requires a recycling process and observation after the transfer of probe marks, thus requiring a long inspection time. An evaluation apparatus of Japanese Patent Application Publication No. H05-157790 has a complicated structure, and therefore cannot be adapted to a double-sided prober which brings probes into contact with both side of a semiconductor device.

SUMMARY OF THE INVENTION

The present invention has been accomplished to solve the above-described problems, and an object of the present invention is to provide an evaluation apparatus and a probe position inspection method which make it possible to accurately inspect in-plane positions of tips of probes in a short time and which are adapted to a double-sided prober.

The features and advantages of the present invention may be summarized as follows.

According to one aspect of the present invention, an evaluation apparatus includes a supporting unit configured to fix a semiconductor device in place and cause an upper surface and a lower surface of the semiconductor device to be exposed, a first insulating plate provided above the supporting unit, a second insulating plate provided below the supporting unit, a plurality of first probes fixed to the first insulating plate, a plurality of second probes fixed to the second insulating plate, and a probe position inspection apparatus attached to the supporting unit. The probe position inspection apparatus includes a casing including a first transparent member on a side of the first insulating plate and a second transparent member on a side of the second insulating plate, an internal prism provided in the casing, a prism rotating unit for rotating the internal prism in the casing, and an imaging unit provided outside the casing to take an image of any of the plurality of first probes contacting the first transparent member and the plurality of second probes contacting the second transparent member through the internal prism.

According to another aspect of the present invention, an evaluation apparatus includes a supporting unit configured to fix a semiconductor device in place and cause an upper surface and a lower surface of the semiconductor device to be exposed, a first insulating plate provided above the supporting unit, a second insulating plate provided below the supporting unit, a plurality of first probes fixed to the first insulating plate, a plurality of second probes fixed to the second insulating plate, and a probe position inspection apparatus attached to the supporting unit. The probe position inspection apparatus includes a casing including a transparent member on any one of a side of the first insulating plate and a side of the second insulating plate, an internal prism provided in the casing, a casing rotating unit for rotating the casing, and an imaging unit provided outside the casing to take an image of any of the plurality of first probes and the plurality of second probes contacting the transparent member through the internal prism.

According to another aspect of the present invention, a probe position inspection method includes a first contact step of bringing a plurality of first probes into contact with a first transparent member of a probe position inspection apparatus, the plurality of first probes being located above the first transparent member, the probe position inspection apparatus includes a casing and an internal prism provided inside the casing, the casing includes the first transparent member and a second transparent member facing the first transparent member, a first imaging step of taking an image of the plurality of first probes through the first transparent member and the internal prism with an imaging unit, a prism rotating step of rotating the internal prism without rotating the casing, a second contact step of bringing a plurality of second probes located below the second transparent member into contact with the second transparent member, a second imaging step of taking an image of the plurality of second probes through the second transparent member and the internal prism with the imaging unit, and a determination step of making a determination based on the images taken with the imaging unit as to any one of whether positions of the plurality of first probes and the plurality of second probes are at predetermined positions or not and whether relative positions between the plurality of first probes and the plurality of second probes are predetermined ones or not. The probe position inspection apparatus is attached to a supporting unit for supporting a semiconductor device.

According to another aspect of the present invention, a probe position inspection method includes a first contact step of bringing a plurality of first probes into contact with a transparent member of a probe position inspection apparatus, the plurality of first probes being located above the transparent member, the probe position inspection apparatus includes a casing and an internal prism provided inside the casing, the casing includes the transparent member, a first imaging step of taking an image of the plurality of first probes through the transparent member and the internal prism with an imaging unit, a casing rotating step of rotating the casing together with the internal prism, a second contact step of bringing a plurality of second probes located below the transparent member into contact with the transparent member, a second imaging step of taking an image of the plurality of second probes through the transparent member and the internal prism with the imaging unit, and a determination step of making a determination based on the images taken with the imaging unit as to any one of whether positions of the plurality of first probes and the plurality of second probes are at predetermined positions or not and whether relative positions between the plurality of first probes and the plurality of second probes are predetermined ones or not. The probe position inspection apparatus is attached to a supporting unit for supporting a semiconductor device.

Other and further objects, features and advantages of the invention will appear more fully from the following description.

DETAILED DESCRIPTION OF THE PREFERRED EMBODIMENTS

Evaluation apparatuses and probe position inspection methods according to embodiments of the present invention will be described with reference to the drawings. The same or corresponding components will be denoted by the same reference signs, and the repetition of explanation thereof may be omitted.

First Embodiment

Figure 1:
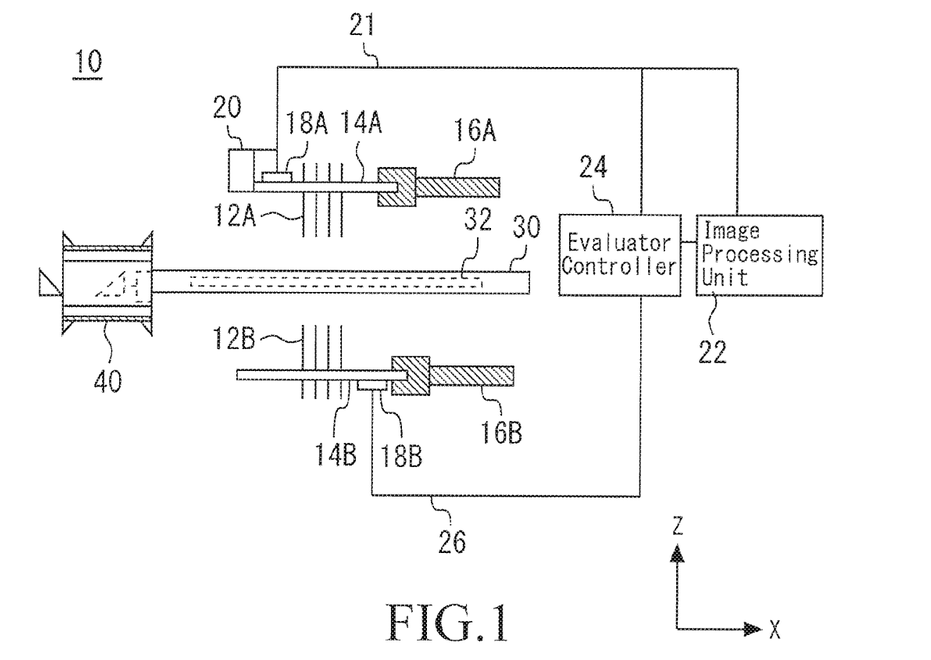
FIG. 1 is a front view of an evaluation apparatus.

FIG. 1 is a front view of an evaluation apparatus 10. The evaluation apparatus 10 includes a first insulating plate 14A for fixing a plurality of first probes 12A in place and a second insulating plate 14B for fixing a plurality of second probes 12B in place. The first insulating plate 14A is moved in any direction by an arm 16A, and the second insulating plate 14B is moved in any direction by an arm 16B. The first insulating plate 14A may be moved by a plurality of arms, and the second insulating plate 14B may be moved by a plurality of arms.

A supporting unit 30 for fixing the semiconductor device 32 in place is provided between the first probes 12A and the second probes 12B. The supporting unit 30 fixes the semiconductor device 32 in place with upper and lower surfaces of the semiconductor device 32 exposed. The semiconductor device 32 is typically, but not limited to, a semiconductor wafer having a plurality of semiconductor chips formed therein or a semiconductor chip itself, and may be a semiconductor device in any form. The first insulating plate 14A is provided above the supporting unit 30, and the second insulating plate 14B is provided below the supporting unit 30.

Figure 2:
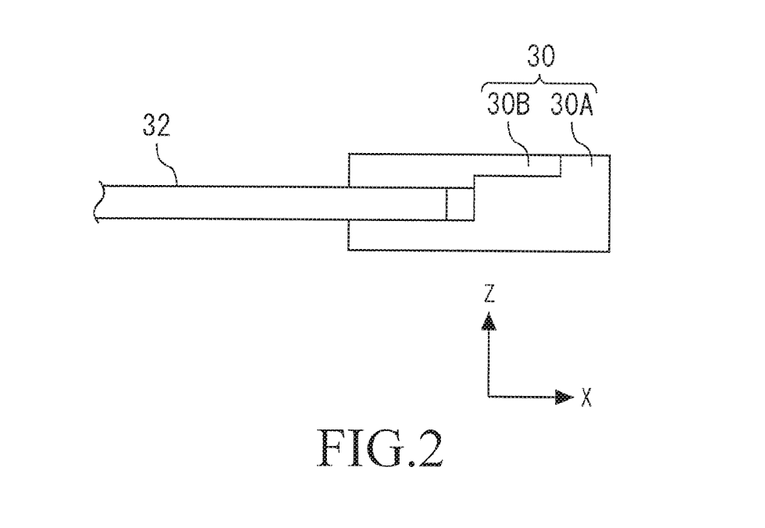
FIG. 2 is a cross-sectional view of the supporting unit and the semiconductor device.

FIG. 2 is a cross-sectional view of the supporting unit 30 and the semiconductor device 32. The supporting unit 30 includes a first portion 30A and a second portion 30B which have such shapes that the first and second portions 30A and 30B can be fitted to each other. The first portion 30A contacts an outer circumferential portion of a back surface of the semiconductor device 32, and the second portion 30B contacts an outer circumferential side of a front surface of the semiconductor device 32. Thus, the semiconductor device 32 is clamped by the supporting unit 30 to be fixed in place. It should be noted that the second portion 30B may be omitted.

Referring back to FIG. 1, the evaluation apparatus 10 constitutes a double-sided prober including the first probes 12A which contact the upper surface of the semiconductor device 32 and the second probes 12B which contact the lower surface of the semiconductor device 32. The semiconductor device 32 has a vertical structure in which a large current is passed in a vertical direction, i.e., an out-of-plane direction. The first probes 12A are connected to an evaluator/controller 24 through a connecting unit 18A and a signal line 21. The second probes 12B are connected to the evaluator/controller 24 through a connecting unit 18B and a signal line 26.

The numbers of the first probes 12A and the second probes 12B are two or more on the assumption that a large current of, for example, 5A or more is applied. To make current densities of the probes approximately equal, the distance from the connecting unit 18A to the connecting unit 18B through any probe needs to be approximately equal. To realize this, it is preferred that the semiconductor device 32 is interposed between the connecting unit 18A and the connecting unit 18B. It should be noted that wiring such as metal plates provided on the insulating plates is used to connect the first probes 12A and the connecting unit 18A and connect the second probes 12B and the connecting unit 18B.

Figure 3:
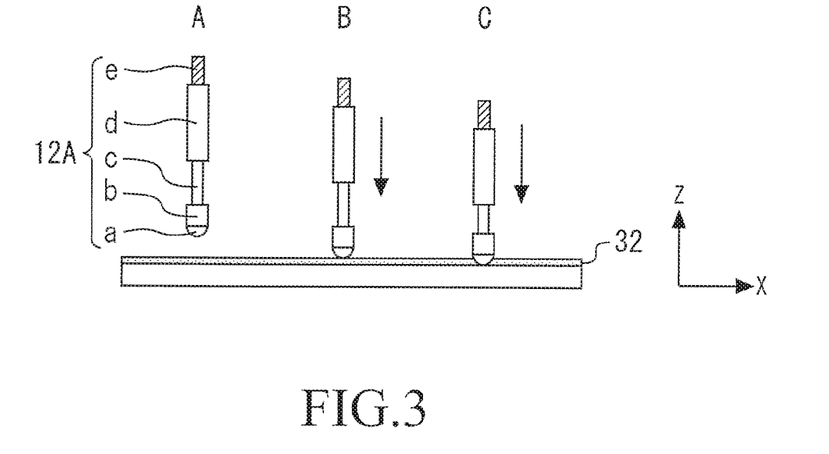
FIG. 3 is a view showing extendable and contractable probes.

The first probes 12A and the second probes 12B are portions which come in contact with the semiconductor device as an object to be measured, and are therefore preferably extendable and contractable in the longitudinal direction so as not to cause damage to the semiconductor device. FIG. 3 is a view showing extendable and contractable probes. FIG. 3 shows the first probes 12A configured to be extendable and contractable which are being brought into contact with the semiconductor device 32. The first probes 12A includes a barrel portion d formed as a base and connected to the first insulating plate 14A, a contact portion a which comes in mechanical and electrical contact with an electrode of the semiconductor device 32, a plunger portion b including a push-in portion c which includes a spring member such as a spring inside to be extendable and contractable in the longitudinal direction, and an electrical connecting portion e electrically communicating with the plunger portion b to serve as an output terminal to the outside.

The conductivity of the first probes 12A may be ensured by making the first probes 12A of a conductive metallic material such as copper, tungsten, or rhenium-tungsten alloy, or may be ensured using a coating of, for example, gold, palladium, tantalum, platinum, or the like from the viewpoints of improving conductivity, improving durability, and the like. In FIG. 3, A shows an initial state in which the first probes 12A and the semiconductor device 32 are not in contact with each other. B shows a state in which the contact portion a and the semiconductor device 32 have been brought into contact with each other by lowering the first probes 12A down along the z axis. C shows a state in which the contact between the first probes 12A and the semiconductor device 32 has been made reliable by further lowering the first probes 12A from the state denoted by B and thus contracting the spring member of the push-in portion c. All the probes are preferably configured similarly to the first probes 12A in FIG. 3. The spring member may be provided outside the probe. It should be noted that the first probes 12A and the second probes 12B are not limited to the above-described one, and cantilever probes, stacked probes, wire probes, or the like may be employed.

An imaging unit 20 is provided on the first insulating plate 14A. The imaging unit 20 takes an image in the negative z direction. An example of the imaging unit 20 is a CCD camera. The imaging unit 20 is connected to an image processing unit 22 through the signal line 21.

A probe position inspection apparatus 40 is attached to a side surface of the supporting unit 30. The probe position inspection apparatus 40 is provided to check whether the positions of tips of the first probes 12A and the second probes 12B are misaligned or not before electrical evaluation on the semiconductor device 32 is performed.

Figure 4:
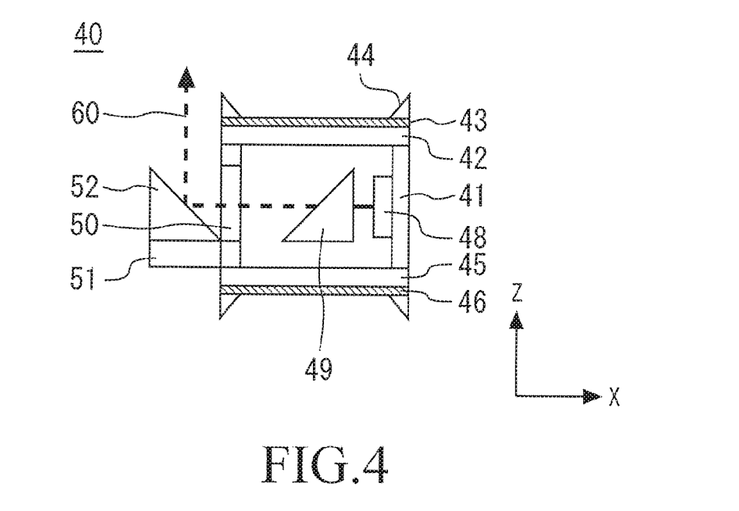
FIG. 4 is a cross-sectional view of the probe position inspection apparatus.

FIG. 4 is a cross-sectional view of the probe position inspection apparatus 40. The probe position inspection apparatus 40 includes a casing 41. The casing 41 has upper and lower surfaces formed by transparent members. Specifically, the casing 41 includes a first transparent member 42 on the first insulating plate 14A side and a second transparent member 45 on the second insulating plate 14B side. Since the first transparent member 42 and the second transparent member 45 are subjected to pressure from the probes, the first transparent member 42 and the second transparent member 45 are formed by strong members so as to prevent breakage due to the pressure. For example, the first transparent member 42 and the second transparent member 45 are glass plates of several millimeters or more.

A transparent protective film 43 is provided on a surface of the first transparent member 42, and a transparent protective film 46 is provided on a surface of the second transparent member 45. The protective films 43 and 46 are softer than the first transparent member 42 and the second transparent member 45. The protective films 43 and 46 are preferably easily-replaceable sheet members with transparency and flexibility. Examples of the protective films 43 and 46 are PVC sheets.

Illuminators 44 are attached to the probe position inspection apparatus 40. Two illuminators 44 are provided above the first transparent member 42 so as to light up the first transparent member 42, and two illuminators 44 are provided below the second transparent member 45 so as to light up the second transparent member 45. As the illuminators 44, LED light sources are preferably used which generate less heat and have longer lives than incandescent bulbs.

An internal prism 49 is provided in the casing 41. A prism rotating unit 48 for rotating the internal prism 49 inside the casing 41 is attached to the internal prism 49. The prism rotating unit 48 includes, for example, an electric motor.

An external prism 52 is provided outside the casing 41. Specifically, the external prism 52 is provided on an installation stage 51 attached to the casing 41. Glass 50 is provided in a portion of the casing 41 which is sandwiched between the internal prism 49 and the external prism 52 so that a probe image took may reach the external prism 52 through the internal prism 49 and then through the glass 50. Such an optical path is shown as an optical path 60 in FIG. 4. Instead of providing the glass 50, a hole may be simply provided in a side surface of the casing 41. However, to reduce the entry of dust and foreign matter into the casing 41, it is better to provide the transparent glass 50.

To avoid false recognition due to a disturbance factor at the time of taking an image, it is desirable to apply an antireflection coating such as black paint to inner walls of the casing 41 or to provide an antireflection film on inner walls of the casing 41. In particular, it is recommended to apply an antireflection coating or add an antireflection film to the first transparent member 42 and the second transparent member 45.

Figure 5:
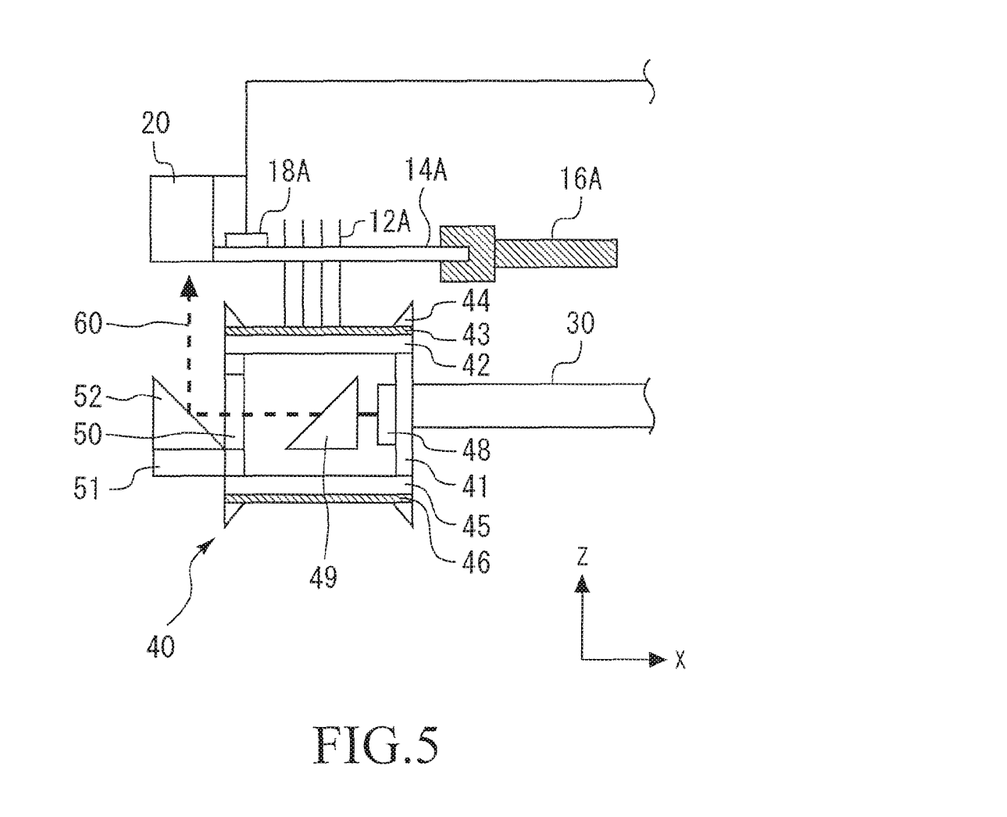
FIG. 5 is a view showing a state in which the first probes and the first transparent member have been brought into contact with each other.

Next, a probe position inspection method using the above-described evaluation apparatus 10 will be described. Before electrical evaluation on the semiconductor device, whether in-plane positions of tips of the probes are appropriate or not is checked. First, the first probes 12A located above the first transparent member 42 are brought into contact with the first transparent member 42. This step is referred to as a first contact step. FIG. 5 is a view showing a state in which the first probes 12A and the first transparent member 42 have been brought into contact with each other with the protective film 43 interposed therebetween. The first probes 12A are pressed against the protective film 43 by moving the arm 16A. Thus, the first probes 12A are brought into indirect contact with the first transparent member 42.

Then, the process is moved to a first imaging step. In the first imaging step, an image of the first probes 12A is taken by the imaging unit 20 through the first transparent member 42, the internal prism 49, and the external prism 52. More specifically, an image of the first probes 12A is reflected by the internal prism 49 located below the first probes 12A to reach the external prism 52 and is reflected in the positive z direction by the external prism 52. Thus, the imaging unit 20 can take an image. The internal prism 49 and the external prism 52 are members for guiding to the imaging unit 20 an image of the first probes 12A which has passed through the first transparent member 42. A result of imaging thus obtained contains the positions of tips of the first probes 12A. When an image is taken, the first probes 12A are lit up by the illuminators 44 to stabilize imaging conditions. An image taken is sent to the image processing unit 22.

Then, the process is moved to a prism rotating step. In the prism rotating step, the internal prism 49 is rotated without rotating the casing 41. By rotating the internal prism 49, a reflecting surface of the internal prism 49 is faced in the negative z direction. This causes a change from a state in which an image is taken in the positive z direction to a state in which an image is taken in the negative z direction.

Figure 6:
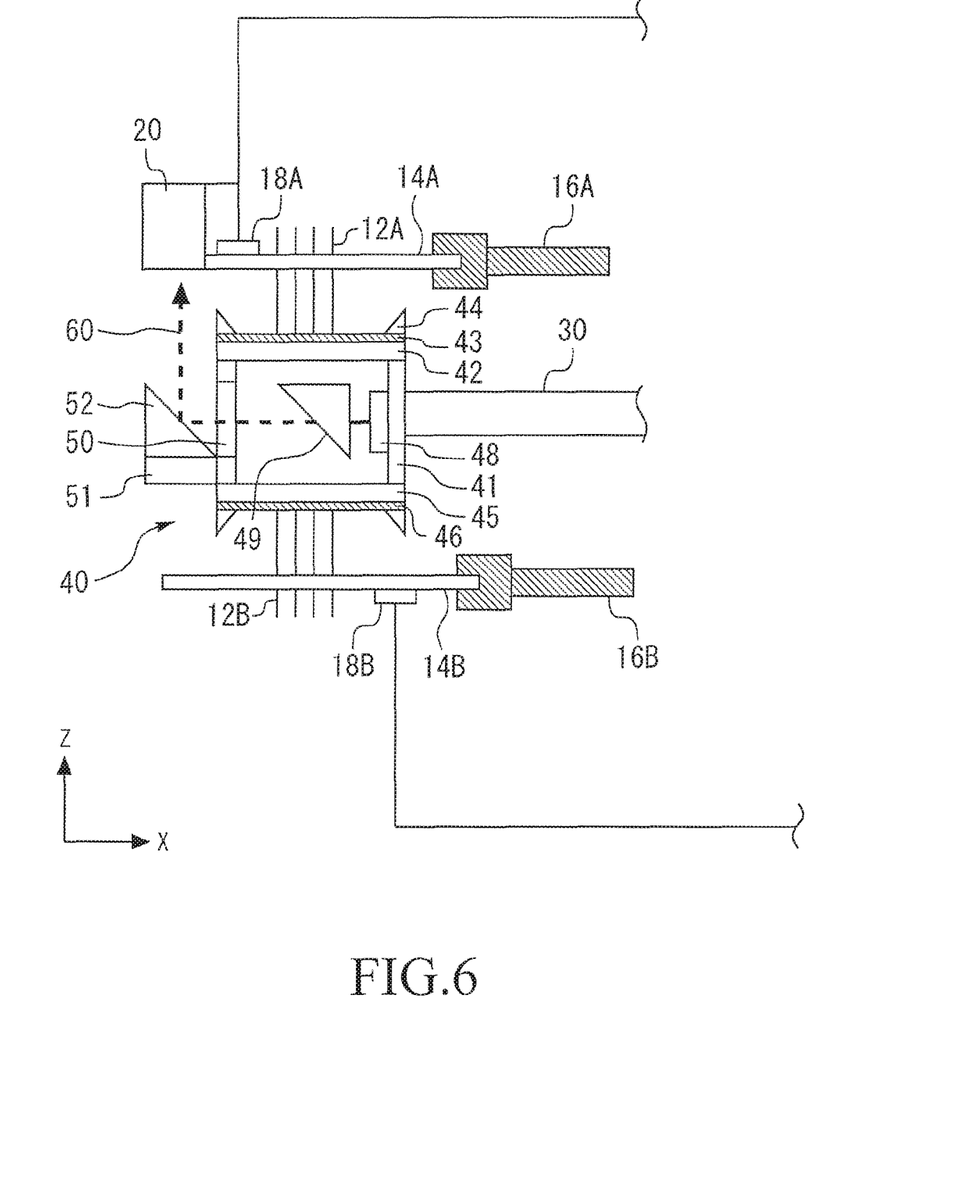
FIG. 6 is a view showing a state in which the second probes and the second transparent member have been brought into contact with each other.

Then, the process is moved to a second contact step. In the second contact step, the second probes 12B located below the second transparent member 45 are brought into contact with the second transparent member 45. FIG. 6 is a view showing a state in which the second probes 12B and the second transparent member 45 have been brought into contact with each other with the protective film 46 interposed therebetween. The second probes 12B are pressed against the protective film 46 by moving the arm 16B. Thus, the second probes 12B are brought into indirect contact with the second transparent member 45.

Then, the process is moved to a second imaging step. In the second imaging step, an image of the second probes 12B is taken by the imaging unit 20 through the second transparent member 45, the internal prism 49, and the external prism 52. More specifically, an image of the second probes 12B is reflected by the internal prism 49 located above the second probes 12B to reach the external prism 52 and is reflected in the positive z direction by the external prism 52. Thus, the imaging unit 20 can take an image. A result of imaging thus obtained contains the positions of tips of the second probes 12B. When an image is taken, the second probes 12B are lit up by the illuminators 44 installed below the second transparent member 45 to stabilize imaging conditions. An image taken is sent to the image processing unit 22.

Figure 7:
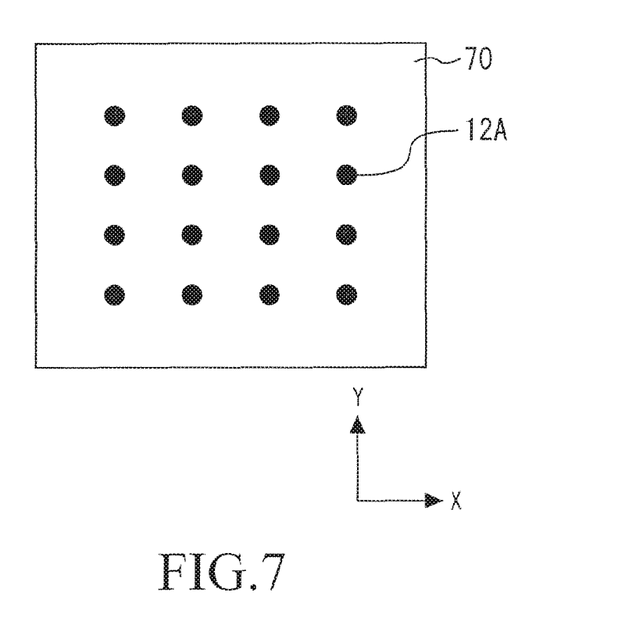
FIG. 7 is an image of first probes.

Then, the process is moved to a determination step. In the determination step, a determination is made based on the images taken by the imaging unit 20 as to whether the positions of tips of the first probes 12A and the second probes 12B are located at predetermined positions or not, or based on the comparison between the image obtained in the first imaging step and the image obtained in the second imaging step as to whether relative positions between the first probes 12A and the second probes 12B are predetermined ones or not. It should be noted that both of these determinations may be made. Since probes are brought into contact with upper and lower surfaces of a semiconductor device at the same time in a double-sided prober, it is important to manage the relative positions between the first probes 12A and the second probes 12B. The relative positions mean the positions of the first probes 12A with respect to the second probes 12B in the XY plane. In the determination step, the image processing unit 22 performs image processing on the image obtained by the imaging unit 20. FIG. 7 is a taken image 70 obtained in the case where, for example, 16 first probes 12A are located at proper positions.

If there is no abnormality as in the above-described example, the process is moved to a measurement step. In the measurement step, while the first probes 12A are touched to the upper surface of the semiconductor device 32, the second probes 12B are touched to the lower surface of the semiconductor device 32 to measure electrical characteristics of the semiconductor device 32. It should be noted that the semiconductor device 32 is fixed to the supporting unit 30 at an appropriate time before the measurement step is started.

Figure 8:
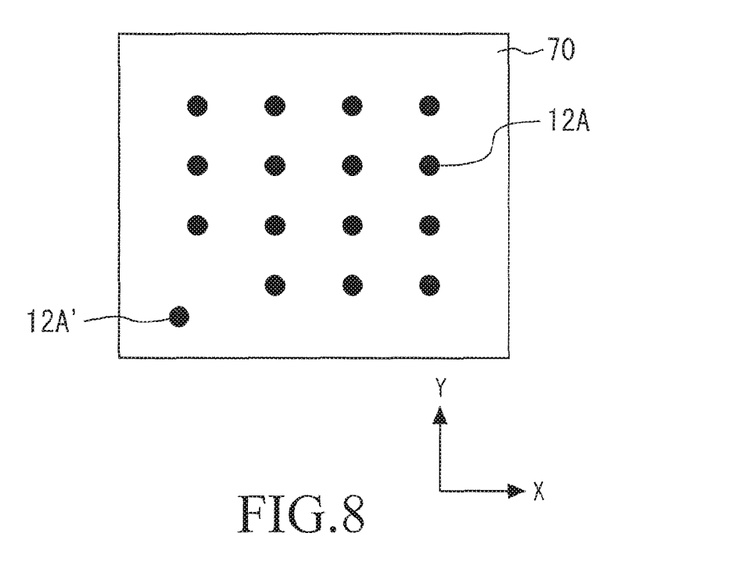
FIG. 8 is an image of first probes.

FIG. 8 is an image taken in the case where there is an abnormality in probe positions. In FIG. 8, there is a problem with the position of the bottom-left probe 12A'. In the case where a probe position problem is detected, an abnormal position alarm is sent from the image processing unit 22 to the evaluator/controller 24. In this case, the measurement of the semiconductor device in the next step is not performed, and the first probes 12A or the second probes 12B are checked. It should be noted that instead of making a determination of the image obtained in the first imaging step and the image obtained in the second imaging step in the determination step, a determination of the image obtained in the first imaging step may be made before the prism rotating step. A process for obtaining images of the first probes 12A and the second probes 12B and inspecting in-plane position accuracies thereof may be executed every time a semiconductor device to be evaluated is changed or may be executed with a fixed frequency every time measurements of a given number of semiconductor devices have been finished.

The evaluation apparatus and the probe position inspection method according to First embodiment of the present invention do not use probe marks, in other words, do not require a deformable body or a needle mark transfer member, and enable the positions of tips of probes to be easily and quickly inspected. Moreover, since the probe position inspection apparatus 40 is attached to the well-known supporting unit 30, a prior-art evaluation apparatus can be used without change.

The first probes 12A are pressed against the first transparent member 42 when the imaging unit takes an image of the first probes 12A, and the second probes 12B are pressed against the second transparent member 45 when the imaging unit 20 takes an image of the second probes 12B. Accordingly, images of the positions of the first probes 12A and the second probes 12B can be taken in a state in which forces are applied to the first probes 12A and the second probes 12B as in the measurement of the semiconductor device 32. Thus, probe positions at the time of the measurement of the semiconductor device can be known. Preferably, the first probes 12A are pressed against the first transparent member 42 with a pressing force equal to a pressing force applied to the semiconductor device in the first imaging step, and the second probes 12B are pressed against the second transparent member 45 with a pressing force equal to a pressing force applied to the semiconductor device in the second imaging step.

Moreover, by pressing the first probes 12A against the first transparent member 42 at the time of taking an image of the first probes 12A with the imaging unit 20 and pressing the second probes 12B against the second transparent member 45 at the time of taking an image of the second probes 12B with the imaging unit 20, the distances from the imaging unit 20 to the first probes 12A or the second probes 12B can be fixed. Accordingly, the tips of the probes can be reliably detected.

Providing the imaging unit 20 outside the casing 41 makes the maintenance of the imaging unit 20 easier and makes operations such as connecting the imaging unit 20 and the image processing unit 22 easier than in the case where the imaging unit 20 is provided in the casing 41. Moreover, since an image of the first probes 12A contacting the first transparent member 42 or the second probes 12B contacting the second transparent member 45 is taken through the internal prism 49, the configuration is very simple.

The protective films 43 and 46 protect the surfaces of the first transparent member 42 and the second transparent member 45 with which the tips of the probes come in contact every time an inspection is performed. When the protective films 43 and 46 are damaged, only the protective films 43 and 46 need to be replaced, but the first transparent member 42 and the second transparent member 45 do not need to be replaced.

Various modifications can be made to the evaluation apparatus and the probe position inspection method according to First embodiment of the present invention within a range in which features thereof are not lost. For example, the illuminators 44 may be provided on the first insulating plate 14A or the second insulating plate 14B. In that case, wiring relating to lighting can be collected on the insulating plates. The imaging unit 20 may be installed on a side surface of the casing 41. In that case, the external prism 52 becomes unnecessary.

The above-described method may be realized by moving the supporting unit 30 in the positive and negative x directions with the positions of the first insulating plate 14A and the second insulating plate 14B in the x direction fixed. The protective films 43 and 46 may be omitted. The imaging unit 20 is intended to take an image of the first probes 12A or the second probes 12B through the first transparent member 42 or the second transparent member 45, the internal prism 49, and the external prism 52, and may therefore be attached to the second insulating plate 14B. Installing the imaging unit 20 on the first insulating plate 14A or the second insulating plate 14B enables wiring necessary for the imaging unit 20 to be collected on the first insulating plate 14A or the second insulating plate 14B.

As the imaging unit 20, a well-known camera used to align probes may be used instead of a new camera. These modifications can be appropriately applied to an evaluation apparatus and a probe position inspection method according to an embodiment below. It should be noted that the evaluation apparatus and the probe position inspection method according to the embodiment below have many things in common with those of First embodiment, and therefore differences from First embodiment will be mainly described.

Second Embodiment

Figure 9:
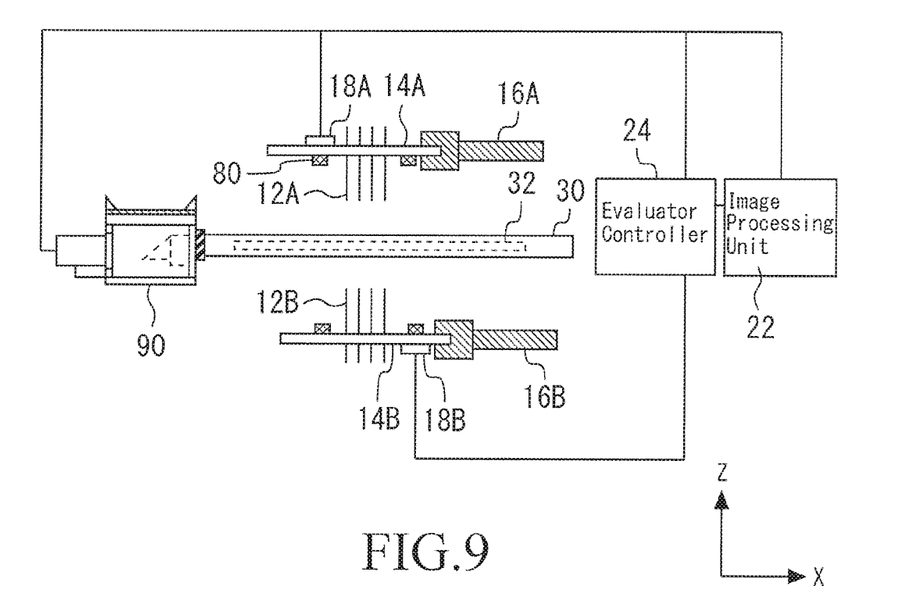
FIG. 9 is a front view of an evaluation apparatus according to Second embodiment.

FIG. 9 is a front view of an evaluation apparatus according to Second embodiment. Illuminators 80 are attached to the first insulating plate 14A and the second insulating plate 14B. The illuminators 80 attached to the first insulating plate 14A throw light in the negative z direction, and the illuminators 80 attached to the second insulating plate 14B throw light in the positive z direction. Attaching the illuminators 80 to the first insulating plate 14A or the second insulating plate 14B enables wiring relating to lighting to be collected on the insulating plates.

Figure 10:
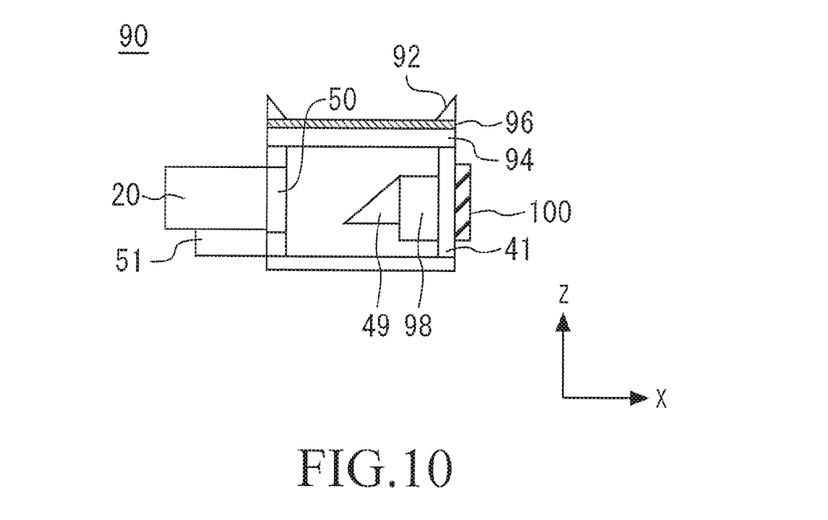
FIG. 10 is a cross-sectional view of the probe position inspection apparatus.

A probe position inspection apparatus 90 is attached to a side surface of the supporting unit 30. FIG. 10 is a cross-sectional view of the probe position inspection apparatus 90 according to Second embodiment. A reflecting mirror 92 is attached to the casing 41. The reflecting mirror 92 is intended to guide light from the illuminators 80 into the casing 41. A transparent member 94 is provided at one side of the casing 41. A transparent protective film 96 is provided on a surface of the transparent member 94. The protective film 96 is softer than the transparent member 94.

In the casing 41, the internal prism 49 exists which is fixed to an installation unit 98. A casing rotating unit 100 for rotating the casing 41 is connected to the casing 41. An example of the casing rotating unit 100 is an electric motor. When the casing 41 is rotated, the internal prism 49 is also rotated along with the foregoing.

The imaging unit 20 is attached to the casing 41. The imaging unit 20 may be fixed directly to the casing 41, but FIG. 10 shows the imaging unit 20 placed on the installation stage 51 attached to the casing 41. The imaging unit 20 takes an image of the first probes 12A or the second probes 12B contacting the transparent member 94 through the internal prism 49.

Figure 11:
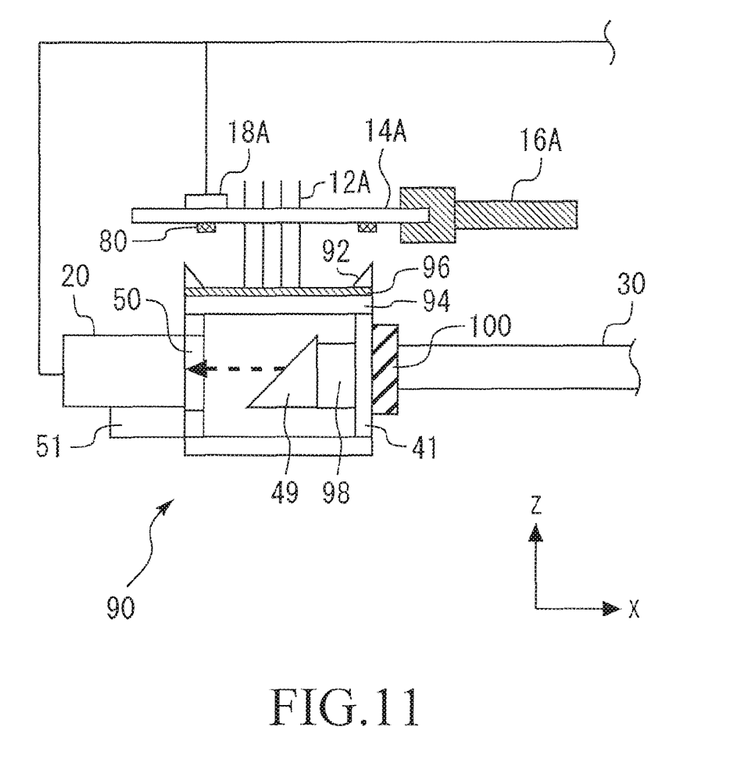
FIG. 11 is a view showing the first probes coming in contact with the transparent member.

A probe position inspection method according to Second embodiment will be described. First, in the first contact step, the first probes 12A located above the transparent member 94 are brought into contact with the transparent member 94. FIG. 11 is a view showing the first probes 12A coming in contact with the transparent member 94 with the protective film 96 interposed therebetween. The internal prism 49 is located directly under the first probes 12A.

Then, in the first imaging step, an image of the first probes 12A is taken by the imaging unit 20 through the transparent member 94 and the internal prism 49. At this time, light from the illuminators 80 is reflected by the reflecting mirror 92 to be shone on the first probes 12A, thus stabilizing imaging conditions. When the first imaging step is finished, the first probes 12A are raised to be separated from the transparent member 94.

Figure 12:
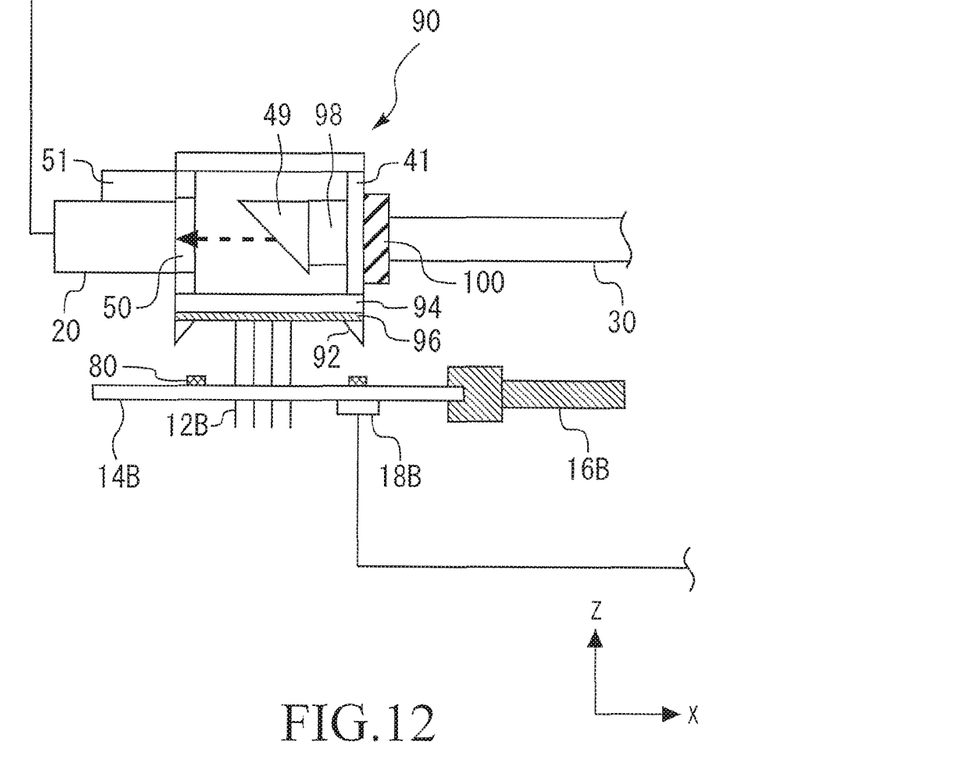
FIG. 12 shows the probe position inspection apparatus.

Then, the process is moved to a casing rotating step. In the casing rotating step, the casing 41 is rotated together with the internal prism 49 using the casing rotating unit 100. Rotating the casing 41 causes the transparent member 94 to turn from facing the first insulating plate 14A to facing the second insulating plate 14B. FIG. 12 shows the probe position inspection apparatus 90 and the like after the casing rotating step.

Then, the process is moved to the second contact step. In the second contact step, the second probes 12B located below the transparent member 94 are brought into contact with the transparent member 94. Then, the process is moved to the second imaging step. In the second imaging step, an image of the second probes 12B is taken by the imaging unit 20 through the transparent member 94 and the internal prism 49.

Then, the process is moved to the determination step. In the determination step, a determination is made based on the images taken by the imaging unit 20 as to whether the positions of the first probes 12A and the second probes 12B are located at predetermined positions or not, or based on the comparison between the image obtained in the first imaging step and the image obtained in the second imaging step as to whether relative positions between the first probes 12A and the second probes 12B are predetermined ones or not. It should be noted that both of these determinations may be made. If a result of the determination is favorable, electrical characteristics of the semiconductor device 32 are measured. If an abnormality in probe positions is detected in the result of the determination, a cause of the abnormality is investigated.

The evaluation apparatus and the probe position inspection method according to Second embodiment of the present invention enable in-plane positions of tips of probes to be accurately inspected in a short time as in First embodiment. Moreover, since the transparent member 94 only needs to be provided at one side of the casing 41, the configuration can be made simpler than in First embodiment.

The external prism 52 described in First embodiment may be provided outside the casing 41. In that case, the imaging unit 20 is attached to the first insulating plate 14A or the second insulating plate 14B. Then, an image of the first probes 12A or the second probes 12B is taken through the transparent member 94, the internal prism 49, and the external prism.

Technical features described in First embodiment and technical features described in Second embodiment may be appropriately combined.

According to the present invention, a probe position inspection apparatus which incorporates a rotatable internal prism is attached to a supporting unit for supporting semiconductor device. Thus, in-plane positions of tips of probes can be accurately inspected in a short time.

Obviously many modifications and variations of the present invention are possible in the light of the above teachings. It is therefore to be understood that within the scope of the appended claims the invention may be practiced otherwise than as specifically described.

What is claimed is:

1. An evaluation apparatus comprising:
   a supporting unit configured to fix a semiconductor device in place and cause an upper surface and a lower surface of the semiconductor device to be exposed;
   a first insulating plate provided above the supporting unit;
   a second insulating plate provided below the supporting unit;
   a plurality of first probes fixed to the first insulating plate;
   a plurality of second probes fixed to the second insulating plate; and
   a probe position inspection apparatus attached to the supporting unit,
   wherein the probe position inspection apparatus comprises:
      a casing including a first transparent member on a side of the first insulating plate and a second transparent member on a side of the second insulating plate;
      an internal prism provided in the casing;
      a prism rotating unit for rotating the internal prism in the casing; and
      an imaging unit provided outside the casing to take an image of any of the plurality of first probes contacting the first transparent member and the plurality of second probes contacting the second transparent member through the internal prism.

2. An evaluation apparatus comprising:
   a supporting unit configured to fix a semiconductor device in place and cause an upper surface and a lower surface of the semiconductor device to be exposed;
   a first insulating plate provided above the supporting unit;
   a second insulating plate provided below the supporting unit;
   a plurality of first probes fixed to the first insulating plate;
   a plurality of second probes fixed to the second insulating plate; and
   a probe position inspection apparatus attached to the supporting unit,
   wherein the probe position inspection apparatus comprises:
      a casing including a transparent member on any one of a side of the first insulating plate and a side of the second insulating plate;
      an internal prism provided in the casing;
      a casing rotating unit for rotating the casing; and
      an imaging unit provided outside the casing to take an image of any of the plurality of first probes and the plurality of second probes contacting the transparent member through the internal prism.

3. The evaluation apparatus according to claim 1, further comprising:
   an external prism provided outside the casing,
   wherein the imaging unit is attached to any one of the first insulating plate and the second insulating plate, and takes an image of any of the plurality of first probes and the plurality of second probes through any one of the first transparent member and the second transparent member, the internal prism, and the external prism.

4. The evaluation apparatus according to claim 2, further comprising:
   an external prism provided outside the casing,
   wherein the imaging unit is attached to any one of the first insulating plate and the second insulating plate, and takes an image of any of the plurality of first probes and the plurality of second probes through the transparent member, the internal prism, and the external prism.

5. The evaluation apparatus according to claim 1, wherein the imaging unit is attached to the casing.

6. The evaluation apparatus according to claim 1, wherein the probe position inspection apparatus further comprises a transparent protective film provided on any one of a surface of the first transparent member and a surface of the second transparent member.

7. The evaluation apparatus according to claim 6, wherein the protective film is softer than the first transparent member and the second transparent member.

8. The evaluation apparatus according to claim 2, wherein the probe position inspection apparatus further comprises a transparent protective film provided on a surface of the transparent member.

9. The evaluation apparatus according to claim 8, wherein the protective film is softer than the transparent member.

10. The evaluation apparatus according to claim 1, further comprising:
    an illuminator attached to any one of the first insulating plate and the second insulating plate.

11. The evaluation apparatus according to claim 10, further comprising:
    a reflecting mirror attached to the casing to guide light from the illuminator into the casing.

12. The evaluation apparatus according to claim 1, further comprising:
    an illuminator attached to the probe position inspection apparatus.

13. The evaluation apparatus according to claim 1, further comprising:
    an antireflection coating applied to an inner wall of the casing.

14. The evaluation apparatus according to claim 1, further comprising:

an antireflection film provided on an inner wall of the casing.

15. A probe position inspection method comprising:
   a first contact step of bringing a plurality of first probes into contact with a first transparent member of a probe position inspection apparatus, the plurality of first probes being located above the first transparent member, the probe position inspection apparatus comprising a casing and an internal prism provided inside the casing, the casing comprising the first transparent member and a second transparent member facing the first transparent member;
   a first imaging step of taking an image of the plurality of first probes through the first transparent member and the internal prism with an imaging unit;
   a prism rotating step of rotating the internal prism without rotating the casing;
   a second contact step of bringing a plurality of second probes located below the second transparent member into contact with the second transparent member;
   a second imaging step of taking an image of the plurality of second probes through the second transparent member and the internal prism with the imaging unit; and
   a determination step of making a determination based on the images taken with the imaging unit as to any one of whether positions of the plurality of first probes and the plurality of second probes are at predetermined positions or not and whether relative positions between the plurality of first probes and the plurality of second probes are predetermined ones or not,
   wherein the probe position inspection apparatus is attached to a supporting unit for supporting a semiconductor device.

16. A probe position inspection method comprising:
   a first contact step of bringing a plurality of first probes into contact with a transparent member of a probe position inspection apparatus, the plurality of first probes being located above the transparent member, the probe position inspection apparatus comprising a casing and an internal prism provided inside the casing, the casing comprising the transparent member;
   a first imaging step of taking an image of the plurality of first probes through the transparent member and the internal prism with an imaging unit;
   a casing rotating step of rotating the casing together with the internal prism;
   a second contact step of bringing a plurality of second probes located below the transparent member into contact with the transparent member;
   a second imaging step of taking an image of the plurality of second probes through the transparent member and the internal prism with the imaging unit; and
   a determination step of making a determination based on the images taken with the imaging unit as to any one of whether positions of the plurality of first probes and the plurality of second probes are at predetermined positions or not and whether relative positions between the plurality of first probes and the plurality of second probes are predetermined ones or not,
   wherein the probe position inspection apparatus is attached to a supporting unit for supporting a semiconductor device.

17. The probe position inspection method according to claim 15, further comprising, after the determination step: a measurement step of measuring electrical characteristics of the semiconductor device in a state in which the plurality of first probes are touched to an upper surface of the semiconductor device with the plurality of second probes touched to a lower surface of the semiconductor device.

* * * * *